United States Patent
Oda et al.

(10) Patent No.: US 8,518,745 B2
(45) Date of Patent: Aug. 27, 2013

(54) METHOD OF MANUFACTURING SEMICONDUCTOR DEVICE HAVING A BUMPED WAFER AND PROTECTIVE LAYER

(75) Inventors: Takashi Oda, Ibaraki (JP); Naohide Takamoto, Ibaraki (JP); Takeshi Matsumura, Ibaraki (JP)

(73) Assignee: Nitto Denko Corporation, Osaka (JP)

( * ) Notice: Subject to any disclaimer, the term of this patent is extended or adjusted under 35 U.S.C. 154(b) by 0 days.

(21) Appl. No.: 13/396,554

(22) Filed: Feb. 14, 2012

(65) Prior Publication Data

US 2012/0208350 A1  Aug. 16, 2012

(30) Foreign Application Priority Data

Feb. 15, 2011  (JP) ................ 2011-029884

(51) Int. Cl.
*H01L 21/00*  (2006.01)
(52) U.S. Cl.
USPC .................... 438/110; 438/113; 438/118
(58) Field of Classification Search
None
See application file for complete search history.

(56) References Cited

U.S. PATENT DOCUMENTS

| | | | |
|---|---|---|---|
| 7,521,122 B2 | 4/2009 | Noro et al. | |
| 2002/0197771 A1* | 12/2002 | Dotta et al. | 438/114 |
| 2003/0183947 A1* | 10/2003 | Ohuchi | 257/778 |
| 2005/0008873 A1* | 1/2005 | Noro et al. | 428/423.1 |
| 2007/0141330 A1* | 6/2007 | Morishima et al. | 428/343 |
| 2009/0075429 A1* | 3/2009 | Sato et al. | 438/118 |
| 2010/0190293 A1* | 7/2010 | Maeda et al. | 438/108 |
| 2012/0205820 A1* | 8/2012 | Oda et al. | 257/778 |

FOREIGN PATENT DOCUMENTS

| | | |
|---|---|---|
| JP | 3189799 B2 | 7/2001 |
| JP | 2010093273 | 4/2010 |
| KR | 1020050009160 A | 1/2005 |

OTHER PUBLICATIONS

Korean Patent Office, Office Action issued in KR Patent Application No. 1020120012683, Apr. 11, 2013, Korea, 8 pages.

* cited by examiner

*Primary Examiner* — Scott B Geyer
(74) *Attorney, Agent, or Firm* — Alleman Hall McCoy Russell & Tuttle LLP (57) ABSTRACT

A method of manufacturing a semiconductor device is provided. The method includes the steps of pasting a film for forming a protective layer in which a support base, an adhesive layer, and a thermosetting resin layer are laminated, in that order, onto a bumped wafer in which a low dielectric material layer is formed, with the thermosetting resin layer serving as a pasting surface, and further, peeling the support base and the adhesive layer from the thermosetting resin layer, forming a protective layer by thermally curing the thermosetting resin layer, and dicing the bumped wafer and the protective layer together.

4 Claims, 2 Drawing Sheets

METHOD OF MANUFACTURING SEMICONDUCTOR DEVICE HAVING A BUMPED WAFER AND PROTECTIVE LAYER

BACKGROUND OF THE INVENTION

1. Field of the Invention

The present invention relates to a method of manufacturing a semiconductor device using a film for forming a protective layer in which a support base, an adhesive layer, and a thermosetting resin layer are laminated, in this order.

2. Description of Related Art

Conventionally, because the distance between circuits is becoming shorter as the circuit pattern formed on a semiconductor chip is becoming finer, the capacitance between adjacent circuits is becoming greater. A phenomenon occurs according to which a signal traveling in the circuit becomes slow (signal delay) in proportion to the increase in capacitance. It has been proposed to lower the capacitance between circuits by forming a low dielectric material layer on the circuit using a material having a low dielectric constant, a so-called low-k material (low dielectric material).

Examples of the low dielectric material layer include a $SiO_2$ film (relative permittivity k=4.2), a SiOF film (k=3.5 to 3.7), and a SiOC film (k=2.5 to 2.8). Such a low dielectric material layer is formed on a semiconductor wafer by a plasma CVD method, for example.

However, such a low dielectric material layer is very brittle, and may cause cracks in a dicing step of the semiconductor process and operational abnormality of the semiconductor element. A method of removing the low dielectric material layer first using a laser (laser scribing) and then dicing the material with a blade or the like has been employed recently (see Japanese Patent Application Laid-Open No. 2010-093273, for example).

SUMMARY OF THE INVENTION

There has been a problem with dicing in that the number of steps increases in such a method because the laser scribing is performed first, followed by dicing with a blade or the like. Even when the laser scribing is used, the method has room for improvement in that it cannot sufficiently reduce the generation of cracks because the low dielectric material layer is brittle.

The present invention has been made in view of the above-described problems, and an object thereof is to provide a method of manufacturing a semiconductor device that is capable of preventing cracks in the low dielectric materials layer while suppressing an increase in the number of steps.

The present inventors made investigations to solve these problems associated with conventional approaches. As a result, they found that cracks in the low dielectric material layer can be prevented while suppressing an increase in the number of steps by forming a protective layer on a low dielectric material layer of a bumped wafer, and dicing the bumped wafer and the protective layer together, in accordance with the present invention.

The method of manufacturing a semiconductor device according to the present invention includes the steps of pasting a film for forming a protective layer in which a support base, an adhesive layer, and a thermosetting resin layer are laminated, in this order, onto a low dielectric material layer of a bumped wafer, with the thermosetting resin layer serving as a pasting surface, and further, peeling the support base and the adhesive layer from the thermosetting resin layer, forming a protective layer by thermally curing the thermosetting resin layer, and dicing the bumped wafer and the protective layer together.

According to the above-described configuration, the low dielectric material layer is reinforced by the protective layer because the protective layer is formed on the low dielectric material layer of the bumped wafer. After that, the bumped wafer is diced together with the protective layer. As a result, the low dielectric material layer is diced while reinforced by the protective layer, and therefore the generation of cracks in the low dielectric material layer can be suppressed. Because the low dielectric material layer is diced while reinforced by the protective layer, the low dielectric material layer does not have to be removed in advance by laser scribing or the like. As a result, an increase in the number of steps can be suppressed.

According to the above-described configuration, the melt viscosity of the thermosetting resin layer is preferably $1 \times 10^2$ Pa·S or more and $2 \times 10^4$ Pa·S or less at the temperature when the film for forming a protective layer is pasted onto the bumped wafer, and the shear modulus of the adhesive layer is preferably $3 \times 10^4$ Pa or more and $2 \times 10^6$ Pa or less at the temperature when the film for forming a protective layer is pasted onto the bumped wafer. When the melt viscosity of the thermosetting resin layer is $1 \times 10^2$ Pa·S or more and $2 \times 10^4$ Pa·S or less at the temperature when the film for forming a protective layer is pasted onto the bumped wafer, and the shear modulus of the adhesive layer is $3 \times 10^4$ Pa or more and $2 \times 10^6$ Pa or less at the temperature when the film for forming a protective layer is pasted onto the bumped wafer, the bump can be made to protrude from the thermosetting resin layer when the film for forming a protective layer is pasted onto the bumped wafer. As a result, deterioration of connection reliability can be suppressed.

Because the melt viscosity of the thermosetting resin layer is $1 \times 10^2$ Pa·S or more at the temperature when the film for forming a protective layer is pasted onto the bumped wafer, the thermosetting resin layer can be prevented from being washed away when the film for forming a protective layer is pasted onto the bumped wafer, and the protective layer can be more certainly formed. Because the melt viscosity of the thermosetting resin layer is less than $2 \times 10^4$ Pa·S at the temperature when the film for forming a protective layer is pasted onto the bumped wafer, the bump can be made to more certainly protrude from the thermosetting resin layer.

In the above-described configuration, the thermosetting resin layer preferably has a thickness of 0.05 to 0.9 times the height of the bump. When the thermosetting resin layer has a thickness of 0.05 to 0.9 times the height of the bump, the bump can be made to more certainly protrude from the thermosetting resin layer when the film for forming a protective layer is pasted onto the bumped wafer.

According to the present invention, a method of manufacturing a semiconductor device can be provided that is capable of preventing cracks in a low dielectric material layer while suppressing an increase of the number of steps.

DESCRIPTION OF THE REFERENCE NUMERALS

2 SEMICONDUCTOR WAFER
3 BUMPED WAFER
5 SEMICONDUCTOR CHIP
6 ADHEREND
10 FILM FOR FORMING PROTECTIVE LAYER
12 SUPPORT BASE
14 ADHESIVE LAYER
16 THERMOSETTING RESIN LAYER
17 PROTECTIVE LAYER
22 DICING BLADE
41 LOW DIELECTRIC MATERIAL LAYER
51 BUMP

Description of the Preferred Embodiments

Figure 1:
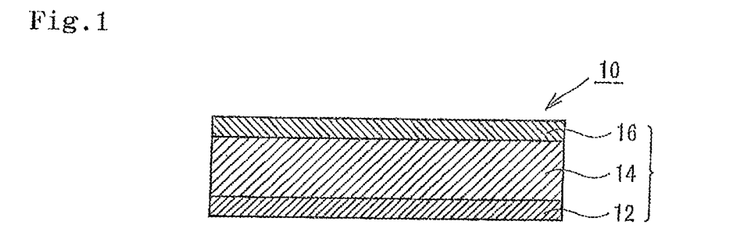
FIG. 1 is a sectional view schematically showing one example of the film for forming a protective layer according to the present embodiment.

An embodiment of the present invention is explained by referring to the drawings. However, the present invention is not limited to these examples. Parts in the drawings that are not necessary for the explanation are omitted, and there may be parts that are shown in magnified or reduced scale to facilitate explanation. First, the film for forming a protective layer according to the present embodiment is explained below. FIG. 1 is a sectional view schematically showing one example of the film for forming a protective layer according to the present embodiment.

Film for Forming Protective Layer

As shown in FIG. 1, a film 10 for forming a protective layer has a configuration in which a support base 12, an adhesive layer 14, and a thermosetting resin layer 16 are laminated, in this order. The surface of the thermosetting resin layer 16 may be protected by a separator or the like until it is pasted onto a wafer.

Figure 2:
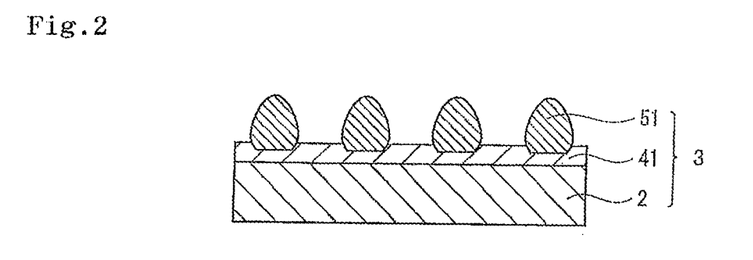
FIG. 2 is a sectional view schematically showing one example of the bumped wafer.

A bumped wafer, to which the film 10 for forming a protective layer is pasted, is explained. FIG. 2 is a sectional view schematically showing one example of the bumped wafer. As shown in FIG. 2, a bumped wafer 3 has a semiconductor wafer 2 and bumps 51 formed on a circuit face side of the semiconductor wafer 2. The bumped wafer 3 has a low dielectric material layer 41 on the circuit face side of the semiconductor wafer 2.

The semiconductor wafer 2 is not especially limited as long as it is a known or common semiconductor wafer, and can be appropriately selected from semiconductor wafers of various types of materials. In the present invention, a silicon wafer can be suitably used as the semiconductor wafer. The thickness of the semiconductor wafer 2 is 10 to 800 μm for example, and above all, a semiconductor wafer having a thickness of 20 to 200 μm can be used. The height of the bump 51 is 5 to 200 μm for example, and above all, the bump 51 having a height of 10 to 100 μm can be generally used.

The low dielectric material layer 41 can be formed by using a material having a low dielectric constant, a so-called low-k material. Examples thereof include a $SiO_2$ film (relative permittivity k=4.2), a SiOF film (k=3.5 to 3.7), and a SiOC film (k=2.5 to 2.8). The low dielectric material layer 41 is formed on the semiconductor wafer 2 by a plasma CVD method or the like.

The melt viscosity of the thermosetting resin layer 16 that constitutes the film 10 for forming a protective layer (see FIG. 1) is preferably $1 \times 10^2$ Pa·S or more and $2 \times 10^4$ Pa·S or less, and more preferably $1 \times 10^3$ Pa·S or more and $1 \times 10^4$ Pa·S or less at the temperature when the film 10 for forming a protective layer is pasted onto the bumped wafer 3. Because the melt viscosity of the thermosetting resin layer 16 is $1 \times 10^2$ Pa·S or more at the temperature when the film 10 for forming a protective layer is pasted onto the bumped wafer 3, the thermosetting resin layer 16 can be prevented from being washed away when the film 10 for forming a protective layer is pasted onto the bumped wafer 3, and a protective layer 17 can be certainly formed (see FIG. 4). Because the melt viscosity of the thermosetting resin layer 16 is less than $2 \times 10^4$ Pa·S at the temperature when the film 10 for forming a protective layer is pasted onto the bumped wafer 3, the bump can be made to more certainly protrude from the thermosetting resin layer 16. The melt viscosity of the thermosetting resin layer 16 can be controlled by the compounding ratio of the thermosetting resin, and the like.

The melt viscosity of the thermosetting resin layer is a value measured by a parallel plate method using a rheometer (RS-1 manufactured by Haake GmbH). More in detail, it is a value obtained by performing the measurement under a condition of a gap of 100 μm, a rotating cone diameter of 20 mm, and a rotational speed of $10 \text{ s}^{-1}$, at a temperature in the range from room temperature to 250° C.

The shear modulus of the adhesive layer 14 that constitutes the film 10 for forming a protective layer (see FIG. 1) is preferably $1 \times 10^3$ Pa or more and $2 \times 10^6$ Pa or less, and more preferably $1 \times 10^4$ Pa or more and $2 \times 10^6$ Pa or less at the temperature when the film 10 for forming a protective layer is pasted onto the bumped wafer 3. When the melt viscosity of the thermosetting resin layer 16 is $1 \times 10^2$ Pa·S or more and $2 \times 10^4$ Pa·S or less at the temperature when the film 10 for forming a protective layer is pasted onto the bumped wafer 3, and the shear modulus of the adhesive layer 14 is $3 \times 10^4$ Pa or more and $2 \times 10^6$ Pa or less at the temperature when the film 10 for forming a protective layer is pasted onto the bumped wafer 3, the bump can be made to protrude from the thermosetting resin layer when the film for forming a protective layer is pasted onto the bumped wafer. As a result, deterioration of connection reliability can be suppressed. The shear modulus of the adhesive layer can be measured by the method described in the examples.

Thermosetting Resin Layer

The thermosetting resin layer 16 is pasted onto the surface where the bumps 51 of the bumped wafer 3 are formed, and is used to hold and fix the bumped wafer 3 when the backside of the bumped wafer 3 is ground. The thermosetting resin layer 16 is thermally cured after being pasted onto the bumped wafer 3 to form the protective layer 17. The protective layer 17 has a function of protecting the low dielectric material layer 41 when the bumped wafer 3 is diced.

The thermosetting resin layer 16 has a film form. The thermosetting resin layer 16 is normally in an uncured state (including a semi-cured state) when it is in a form of the film 10 for forming a protective layer as a product, and is thermally cured after being pasted onto the bumped wafer 3 (see FIG. 2) (details are described later).

The thermosetting resin layer 16 can be constituted as a resin composition containing at least a thermosetting resin. The resin composition may contain a thermoplastic resin.

Examples of the thermosetting resin include an epoxy resin, a phenol resin, an amino resin, an unsaturated polyester resin, a polyurethane resin, a silicone resin, and a thermosetting polyimide resin. The thermosetting resins can be used alone, or two types or more can be used together. An epoxy resin having a small amount of ionic impurities that erode the semiconductor element is especially suitable as the thermosetting resin. Further, a phenol resin can be suitably used as a curing agent for the epoxy resin.

The epoxy resin is not especially limited, and examples thereof include bifunctional epoxy resins and polyfunctional epoxy resins such as a bisphenol A type epoxy resin, a bisphenol F type epoxy resin, a bisphenol S type epoxy resin, a brominated bisphenol A type epoxy resin, a hydrogenated bisphenol A type epoxy resin, a bisphenol AF type epoxy resin, a biphenyl type epoxy resin, a naphthalene type epoxy resin, a fluorene type epoxy resin, a phenol novolac type epoxy resin, an ortho-cresol novolac type epoxy resin, a trishydroxyphenylmethane type epoxy resin, and a tetraphenylolethane type epoxy resin, a hydantoin type epoxy resin, a trisglycidylisocyanurate type epoxy resin, and a glycidylamine type epoxy resin.

As the epoxy resin, a naphthalene type epoxy resin and a trishydroxyphenylmethane type epoxy resin are especially preferable among the examples described above. These epoxy resins can be suitably used to achieve the desired heat resistance during reflow.

The epoxy equivalent of the epoxy resin is preferably 150 to 1000 g/eq, and more preferably 150 to 400 g/eq. By making the epoxy equivalent of the epoxy resin 150 to 400 g/eq, heat resistance can be improved more.

The phenol resin acts as a curing agent for the epoxy resin, and examples thereof include novolac type phenol resins such as a phenol novolac resin, a phenol aralkyl resin, a cresol novolac resin, a tert-butylphenol novolac resin, and a nonylphenol novolac resin, a resol type phenol resin, and polyoxystyrenes such as polyparaoxystyrene. The phenol resins can be used alone or two types or more can be used together. Among these phenol resins, a phenol novolac resin, a cresol novolac resin, and a phenolaralkyl resin can be preferably used to achieve the desired heat resistance.

The phenol equivalent of the phenol resin is preferably 90 to 300 g/eq, more preferably 100 to 270 g/eq, and further preferably 150 to 250 g/eq to achieve the desired heat resistance and the stress relaxation property at a high temperature.

The phenol resin is suitably compounded in the epoxy resin so that a hydroxyl group in the phenol resin to 1 equivalent of an epoxy group in the epoxy resin component becomes 0.5 to 2.0 equivalents. The ratio is more preferably 0.8 to 1.2 equivalents. When the compounding ratio goes out of this range, sufficient curing reaction does not proceed, and the characteristics of the epoxy resin cured substance easily deteriorate.

A thermal curing accelerating catalyst for an epoxy resin and a phenol resin may be used in the present invention. The thermal curing accelerating catalyst is not especially limited, and the catalyst can be appropriately selected from known thermal curing accelerating catalysts. The thermal curing accelerating catalysts can be used alone, or two or more types can be used together. Examples of the thermal curing accelerating catalyst include an amine curing accelerator, a phosphorus curing accelerator, an imidazole curing accelerator, a boron curing accelerator and a phosphorus-boron curing accelerator.

The amine curing accelerator is not especially limited, and examples thereof include monoethanolamine trifluoroborate manufactured by Stella Chemifa and dicyandiamide manufactured by Nacalai Tesque.

The phosphorus curing accelerator is not especially limited, and examples thereof include triorganophosphines such as triphenylphosphine, tributylphosphine, tri(p-methylphenyl)phosphine, tri(nonylphenyl)phosphine, and diphenyltriphosphine, tetraphenyl phosphonium bromide (trade name TPP-PB), methyltriphenylphosphonium (trade name TPP-MB), methyltriphosphonium chloride (trade name TPP-MC), methoxymethyltriphenylphosphonium (trade name TPP-MOC), and benzyltriphenylphosphonium chloride (trade name TPP-ZC) (all are manufactured by Hokko Chemical Industry Co., Ltd.). A triphenylphosphine compound substantially showing insolubility in the epoxy resin is preferable. When the triphenylphosphine compound is insoluble in the epoxy resin, excessive thermal curing can be suppressed. Examples of a thermosetting catalyst having substantial insolubility in the epoxy resin include methyltriphenylphosphonium (trade name TPP-MB). Here, "insolubility" designates that the thermosetting catalyst made of the triphenylphosphine compound is insoluble in a solvent made of an epoxy resin; and in more detail, it designates that the thermoset catalyst does not dissolve in an amount of 10% by weight or more in a temperature range of 10 to 40° C.

Examples of the imidazole curing accelerator include 2-methylimidazole (trade name 2MZ), 2-undecylimidazole (trade name C11-Z), 2-heptadecylimidazole (trade name C17Z), 1,2-dimethylimidazole (trade name 1.2DMZ), 2-ethyl-4-methylimidazole (trade name 2E4MZ), 2-phenylimidazole (trade name 2PZ), 2-phenyl-4-methylimidazole (trade name 2P4MZ), 1-benzyl-2-methylimidazole (trade name 1B2MZ), 1-benzyl-2-phenylimidazole (trade name 1B2PZ), 1-cyanoethyl-2-methylimidazole (trade name 2MZ-CN), 1-cyanoethyl-2-undecylimidazole (trade name C11Z-CN), 1-cyanoethyl-2-phenylimidazolium trimellitate (trade name 2PZCNS-PW), 2,4-diamino-6-[2'-methylimidazolyl-(1')]-ethyl-s-triazine (trade name 2MZ-A), 2,4-diamino-6-[2'-undecylimidazolyl-(1')]-ethyl-s-triazine (trade name C11Z-A), 2,4-diamino-6-['-ethyl-4'-methylimidazolyl-(1')]-ethyl-s-triazine (trade name 2E4MZ-A), 2,4-diamino-6-[2'-methylimidazolyl-(1')]-ethyl-s-triazine isocyanuric acid adduct (trade name 2MA-OK), 2-phenyl-4,5-dihydroxymethylimidazole (trade name 2PHZ-PW), and 2-phenyl-4-methyl-5-dihydroxymethylimidazole (trade name 2P4 MHZ-PW) (all are manufactured by Shikoku Chemicals Corporation).

The boron curing accelerator is not especially limited, and examples thereof include trichloroborane.

The phosphorous-boron curing accelerator is not especially limited, and examples thereof include tetraphenylphosphonium tetraphenylborate (trade name TPP-K), tetraphenylphosphonium tetra-p-triborate (trade name TPP-MK), benzyltriphenylphosphonium tetraphenylborate (trade name TPP-ZK), and triphenylphosphine triphenylborane (trade name TPP-S) (all are manufactured by Hokko Chemical Industry, Co., Ltd.).

The ratio of the thermal curing-accelerating catalyst is preferably 0.01% by weight or more and 10% by weight or less, of the total amount of the thermosetting resin. By making the ratio of the thermal curing-accelerating catalyst 0.01% by weight or more, sufficient curing can be achieved. By making the ratio of the thermal curing-accelerating catalyst 10% by weight or less, the manufacturing cost can be reduced. The ratio of the thermal curing-accelerating catalyst is more preferably 0.1% by weight or more and 5% by weight or less, and further preferably 0.3% by weight or more and 3% by weight or less, of the total amount of the thermosetting resin.

The thermosetting resin layer 16 may be crosslinked to a certain level in advance to improve the adhesion characteristics to the bumped wafer 3 under a high temperature and to improve heat resistance. The thermosetting resin layer 16 can be crosslinked by adding, as a crosslinking agent, a polyfunctional compound that reacts with a functional group or the like at the end of the molecular chain of the polymer during manufacture.

The crosslinking agent is not especially limited, and a known crosslinking agent can be used. Specific examples thereof include an isocyanate crosslinking agent, an epoxy crosslinking agent, a melamine crosslinking agent, a peroxide crosslinking agent, a urea crosslinking agent, a metal alkoxide crosslinking agent, a metal chelate crosslinking agent, a metal salt crosslinking agent, a carbodiimide crosslinking agent, an oxazoline crosslinking agent, an aziridine crosslinking agent, and an amine crosslinking agent. An isocyanate crosslinking agent and an epoxy crosslinking agent are preferable. The crosslinking agents can be used alone or two type or more can be used together.

Examples of the isocyanate crosslinking agent include lower aliphatic polyisocyanates such as 1,2-ethylene diisocyanate, 1,4-butylene isocyanate, and 1,6-hexamethylene diisocyanate; alicyclic polyisocyanates such as cyclopentylene diisocyanate, cyclohexylene diisocyanate, isophorone diisocyanate, hydrogenated tolylene diisocyanate, and hydrogenated xylene diisocyanate; and aromatic polyisocyanates such as 2,4-tolylene diisocyanate, 2,6-tolylene diisocyanate, 4,4'-diphenylmethane diisocyanate, and xylylene diisocyanate. A trimethylolpropane/tolylene diisocyanate trimer adduct (tradename: Coronate L manufactured by Nippon Polyurethane Industry Co., Ltd.) and a trimethylolpropane/hexamethylene diisocyanate trimer adduct (tradename: Coronate HL manufactured by Nippon Polyurethane Industry Co., Ltd.) can also be used. Examples of the epoxy crosslinking agent include N,N,N',N'-tetraglycidyl-m-xylenediamine, diglycidylaniline, 1,3-bis(N,N-glycidylaminomethyl)cyclohexane, 1,6-hexanediol diglycidylether, neopentylglycol diglycidylether, ethyleneglycol diglycidylether, propyleneglycol diglycidylether, polyethyleneglycol diglycidylether, polypropyleneglycol diglycidylether, sorbitol polyglycidylether, glycerol polyglycidylether, pentaerythritol polyglycidylether, polyglycerol polyglycidylether, sorbitan polyglycidylether, trimethylolpropane polyglycidylether, diglycidyl adipate, diglycidyl o-phthalate, triglycidyl-tris(2-hydroxyethyl)isocyanurate, resorcin diglycidylether, bisphenol-s-diglycidyl ether, and an epoxy resin having two or more epoxy groups in the molecule.

The amount of the crosslinking agent used is not especially limited, and can be appropriately selected according to the level of crosslinking. Specifically, the amount of the crosslinking agent used is normally preferably 7 parts by weight or less (0.05 to 7 parts by weight, for example) per 100 parts by weight of a polymer component (especially, a polymer having a functional group at the end of the molecular chain) for example. By making the amount of the crosslinking agent used 7 parts by weight or less per 100 parts by weight of the polymer component, a decrease in adhesive strength can be suppressed. To improve cohesive strength, the amount of the crosslinking agent used is preferably 0.05 parts by weight or more to 100 parts by weight of the polymer component.

In the present invention, it is possible to perform a crosslinking treatment by irradiation with an electron beam, an ultraviolet ray, or the like in place of using the crosslinking agent or together with the crosslinking agent.

Examples of the thermoplastic resin include a natural rubber, a butyl rubber, an isoprene rubber, a chloroprene rubber, an ethylene-vinyl acetate copolymer, an ethylene-acrylate copolymer, an ethylene-acrylic ester copolymer, a polybutadiene resin, a polycarbonate resin, a thermoplastic polyimide resin, polyamide resins such as 6-nylon and 6,6-nylon, a phenoxy resin, an acrylic resin, saturated polyester resins such as PET (polyethylene terephthalate) and PBT (polybutylene terephthalate), a polyamideimide resin, and a fluororesin. The thermoplastic resins can be used alone or two types or more can be used together. Of these thermoplastic resins, acrylic resin is particularly preferable since the resin contains ionic impurities in only a small amount and has a high heat resistance so as to make it possible to ensure the reliability of the semiconductor element.

The acrylic resin is not especially limited, and examples thereof include a polymer having one type or two types or more of acrylates or methacrylates having a linear or branched alkyl group having 30 or less carbon atoms (preferably 4 to 18 carbon atoms, further preferably 6 to 10 carbon atoms, and especially preferably 8 or 9 carbon atoms) as a component. That is, the acrylic resin of the present invention has a broad meaning and also includes a methacrylic resin. Examples of the alkyl group include a methyl group, an ethyl group, a propyl group, an isopropyl group, an n-butyl group, a t-butyl group, an isobutyl group, a pentyl group, an isopentyl group, a hexyl group, a heptyl group, a 2-ethylhexyl group, an octyl group, an isooctyl group, a nonyl group, an isononyl group, a decyl group, an isodecyl group, an undecyl group, a dodecyl group (a lauryl group), a tridecyl group, a tetradecyl group, a stearyl group, and an octadecyl group.

Other monomers that can form the above-described acrylic resin (monomers other than an alkylester of acrylic acid or methacrylic acid having an alkyl group having 30 or less carbon atoms) are not especially limited. Examples thereof include carboxyl-containing monomers such as acrylic acid, methacrylic acid, carboxyethyl acrylate, carboxypentyl acrylate, itaconic acid, maleic acid, fumaric acid, and crotonic acid; acid anhydride monomers such as maleic anhydride and itaconic anhydride; hydroxyl-containing monomers such as 2-hydroxyethyl (meth)acrylate, 2-hydroxypropyl (meth)acrylate, 4-hydroxybutyl (meth)acrylate, 6-hydroxyhexyl (meth)acrylate, 8-hydroxyoctyl (meth)acrylate, 10-hydroxydecyl (meth)acrylate, 12-hydroxylauryl (meth)acrylate, and (4-hydroxymethylcyclohexyl) methylacrylate; monomers which contain a sulfonic acid group, such as styrenesulfonic acid, allylsulfonic acid, 2-(meth)acrylamide-2-methylpropanesulfonic acid, (meth)acrylamidepropane sulfonic acid, sulfopropyl (meth)acrylate, and (meth)acryloyloxynaphthalenesulfonic acid; and monomers which contain a phosphoric acid group, such as 2-hydroxyethylacryloyl phosphate. Among these, a carboxyl group-containing monomer is preferable in that the preferred tensile storage modulus, Ea, of the die bond film can be achieved. (Meth)acrylate refers to an acrylate and/or a methacrylate, and hereinafter, every occurrence of (meth) in the present application has the same meaning.

Other additives can be appropriately compounded in the thermosetting resin layer 16 as necessary. Examples of the other additives include a filler, a flame retardant, a silane coupling agent, an ion trapping agent, an extender, an anti-aging agent, an antioxidant, and a surfactant.

The filler may be any of an inorganic filler and an organic filler. However, an inorganic filler is preferable. By compounding a filler such as an inorganic filler, resistance to thermal stress can be improved. Examples of the inorganic filler include ceramics such as silica, clay, gypsum, calcium carbonate, barium sulfate, aluminum oxide, beryllium oxide, silicon carbide, and silicon nitride, metals such as aluminum, copper, silver, gold, nickel, chromium, lead, tin, zinc, palladium, and solder, alloys, and various inorganic powders consisting of carbon. The fillers may be used alone or two types or more can be used together. Among these, silica, especially molten silica is preferable. The average particle size of the inorganic filler is preferably in a range of 0.1 to 80 μm. The average particle size of the inorganic filler can be measured with a laser diffraction type particle size distribution device, for example.

The compounding amount of the filler (especially, the inorganic filler) is preferably 80 parts by weight or less (0 to 80 parts by weight), and especially preferably 0 to 70 parts by weight to 100 parts by weight of the organic resin component.

Examples of the flame retardant include antimony trioxide, antimony pentoxide, and a brominated epoxy resin. These can be used alone or two types or more can be used together. Examples of the silane coupling agent include β-(3,4-epoxy-cyclohexyl)ethyltrimethoxysilane, γ-glycidoxypropyltri-methoxysilane, and γ-glycidoxypropylmethyldi-ethoxysilane. These compounds can be used alone or two types or more can be used together. Examples of the ion trapping agent include hydrotalcites and bismuth hydroxide. These can be used alone or two types or more can be used together.

The thermosetting resin layer 16 can be formed by a common method of preparing a resin composition by mixing a thermosetting resin such as an epoxy resin, a thermoplastic resin such as an acrylic resin as necessary, and a solvent and other additives as necessary and forming the resin composition into a film-like layer. Specifically, the film-shaped thermosetting resin layer 16 can be formed by a method of applying the resin composition onto the adhesive layer 14 or a method of forming a resin layer by applying the resin composition onto an appropriate separator such as release paper and transferring (transferring by adhesion) the resin layer onto the adhesive layer 14, for example. The resin composition may be a solution or a dispersion liquid.

In the present invention, because the thermosetting resin layer is a film-shaped product formed from a resin composition containing a thermosetting resin, adhesion to the bumped wafer 3 can be effectively exhibited.

The thickness of the thermosetting resin layer 16 (the total thickness in the case of a laminated film) through which the bumps 51 can protrude is sufficient when the thermosetting resin layer 16 is pasted onto the bumped wafer 3, and is preferably 2 to 200 more preferably 2 to 100 μm, and further preferably 5 to 50 μm.

The thickness of the thermosetting resin layer 16 is preferably 0.05 to 0.9 times, and more preferably 0.05 to 0.7 times the height of the bump 51. When the thickness of the thermosetting resin layer 16 is 0.05 to 0.9 times the height of the bump 51, the bumps 51 can be made to more certainly protrude from the thermosetting resin layer 16 when the film 10 for forming a protective layer is pasted onto the bumped wafer 3.

The surface of the thermosetting resin layer 16 is preferably protected by a separator (release liner) (not shown in the drawings). The separator has a function as a protective material to protect the thermosetting resin layer 16 until it is put to practical use. The separator can be used as a support base when the thermosetting resin layer 16 is transferred onto the adhesive layer 14. The separator is peeled when the bumped wafer 3 is pasted onto the film 10 for forming a protective layer. Examples of the separator include polyethylene, polypropylene, plastic films such as polyethylene terephthalate whose surface is coated with a remover such as a fluorine remover or a long chain alkylacrylate remover, and paper. The separator can be formed by a conventionally known method. The thickness and the like of the separator are not especially limited.

Adhesive Layer

The adhesive used to form the adhesive layer 14 is not especially limited, and a general pressure-sensitive adhesive such as an acrylic pressure-sensitive adhesive or a rubber pressure-sensitive adhesive can be used, for example. The pressure-sensitive adhesive is preferably an acrylic pressure-sensitive adhesive containing an acrylic polymer as a base polymer in view of clean washing of electronic components such as a semiconductor wafer and glass, which are easily damaged by contamination, with ultrapure water or an organic solvent such as alcohol.

Specific examples of the acryl polymers include an acryl polymer in which acrylate is used as a main monomer component. Examples of the acrylate include alkyl acrylate (for example, a straight chain or branched chain alkyl ester having 1 to 30 carbon atoms, and particularly 4 to 18 carbon atoms in the alkyl group such as methylester, ethylester, propylester, isopropylester, butylester, isobutylester, sec-butylester, t-butylester, pentylester, isopentylester, hexylester, heptylester, octylester, 2-ethylhexylester, isooctylester, nonylester, decylester, isodecylester, undecylester, dodecylester, tridecylester, tetradecylester, hexadecylester, octadecylester, and eicosylester) and cycloalkyl acrylate (for example, cyclopentylester, cyclohexylester, etc.). These monomers may be used alone, or two or more types may be used in combination.

The acrylic polymer may optionally contain a unit corresponding to a different monomer component copolymerizable with the above-mentioned alkyl ester of (meth)acrylic acid or cycloalkyl ester thereof in order to improve the cohesive force, heat resistance or some other property of the polymer. Examples of such a monomer component include carboxyl-containing monomers such as acrylic acid, methacrylic acid, carboxyethyl (meth)acrylate, carboxypentyl (meth)acrylate, itaconic acid, maleic acid, fumaric acid, and crotonic acid; acid anhydride monomers such as maleic anhydride, and itaconic anhydride; hydroxyl-containing monomers such as 2-hydroxyethyl (meth)acrylate, 2-hydroxypropyl (meth)acrylate, 4-hydroxybutyl (meth)acrylate, 6-hydroxyhexyl (meth)acrylate, 8-hydroxyoctyl (meth)acrylate, 10-hydroxydecyl (meth)acrylate, 12-hydroxylauryl (meth)acrylate, and (4-hydroxylmethylcyclohexyl)methyl (meth)acrylate; sulfonic acid group containing monomers such as styrenesulfonic acid, allylsulfonic acid, 2-(meth)acrylamide-2-methylpropanesulfonic acid, (meth)acrylamidepropanesulfonic acid, sulfopropyl (meth)acrylate, and (meth)acryloyloxynaphthalenesulfonic acid; phosphoric acid group containing monomers such as 2-hydroxyethylacryloyl phosphate; acrylamide; and acrylonitrile. These copolymerizable monomer components may be used alone or in a combination of two or more thereof. The amount of the copolymerizable monomer(s) to be used is preferably 40% or less by weight of all the monomer components.

For crosslinking, the acrylic polymer can also contain multifunctional monomers if necessary as the copolymerizable monomer component. Such multifunctional monomers include hexanediol di(meth)acrylate, (poly)ethylene glycol di(meth)acrylate, (poly)propylene glycol di(meth)acrylate, neopentyl glycol di(meth)acrylate, pentaerythritol di(meth) acrylate, trimethylol propane tri(meth)acrylate, pentaerythritol tri(meth)acrylate, dipentaerythritol hexa(meth)acrylate, epoxy (meth)acrylate, polyester (meth)acrylate, urethane (meth)acrylate etc. These multifunctional monomers can also be used as a mixture of one or more thereof. For the desired adhesiveness, etc., the amount of the multifunctional monomer is preferably 30 wt % or less based on the total monomer content.

Preparation of the above acryl polymer can be performed in an appropriate manner such as solution polymerization, emulsion polymerization, bulk polymerization, and suspension polymerization of a mixture of one or two or more kinds of component monomers, for example. Since the adhesive layer preferably has a composition in which the content of low molecular weight materials is suppressed for preventing wafer contamination, and since the adhesive layer, in which an acryl polymer having a weight-average molecular weight of 300000 or more, particularly 400000 to 1500000 is a main component, is preferable for preventing wafer contamination, the adhesive can be made to have an appropriate cross-linking manner such as an internal cross-linking manner, an external cross-linking manner, etc.

To increase the number-average molecular weight of the base polymer, such as an acrylic polymer etc., an external crosslinking agent can be suitably adopted in the adhesive. The external crosslinking method is specifically a reaction method that involves adding and reacting a crosslinking agent such as a polyisocyanate compound, epoxy compound, aziridine compound, melamine crosslinking agent, urea resin, anhydrous compound, polyamine, or carboxyl group-containing polymer. When the external crosslinking agent is used, the amount of the crosslinking agent to be used is determined according to the base polymer to be crosslinked and applications thereof as the adhesive. Generally, the crosslinking agent is preferably incorporated in an amount of about 5 parts by weight or less based on 100 parts by weight of the base polymer. The lower limit of the crosslinking agent is preferably 0.1 parts by weight or more. The adhesive may be blended not only with the components described above, but also with a wide variety of conventionally known additives such as a tackifier, and an aging inhibitor, if necessary.

The adhesive layer 14 can be formed with an ultraviolet-ray curable adhesive. The adhesive power of the ultraviolet-ray curable adhesive can be easily decreased by increasing the degree of crosslinking through irradiation with an ultraviolet ray. Therefore, when the adhesive layer 14 is formed with an ultraviolet-ray curable adhesive, the support base 12 and the adhesive layer 14 can be peeled from the thermosetting resin layer 16 by decreasing the adhesive strength through irradiation with an ultraviolet ray after the film 10 for forming a protective layer is pasted onto the bumped wafer 3.

The irradiation with an ultraviolet ray is preferably performed at an ultraviolet-ray intensity of 10 to 1000 mJ/cm$^2$ and it is more preferably performed at 100 to 500 mJ/cm$^2$. By making the ultraviolet-ray intensity 10 mJ/cm$^2$ or more, the adhesive layer 14 can be cured sufficiently, and excess adhesion with the thermosetting resin layer 16 can be prevented. As a result, the adhesive layer 14 can be favorably peeled from the thermosetting resin layer 16 at the interface therebetween, and adhesive residue attached to the thermosetting resin layer 16 from the adhesive layer 14 can be prevented. On the other hand, by making the ultraviolet-ray intensity 1000 mJ/cm$^2$ or less, deterioration of the film due to the generation of heat can be suppressed.

An ultraviolet-ray curable adhesive having an ultraviolet-ray curable functional group such as a carbon-carbon double bond and exhibiting adhesion can be used without special limitation. An example of the ultraviolet-ray curable adhesive is an addition-type ultraviolet-ray curable adhesive in which ultraviolet-ray curable monomer components and oligomer components are compounded in a general pressure-sensitive adhesive such as the acrylic pressure-sensitive adhesive or the rubber pressure-sensitive adhesive.

Examples of the ultraviolet-ray curable monomer component to be compounded include a urethane oligomer, urethane (meth)acrylate, trimethylolpropane tri(meth)acrylate, tetramethylolmethane tetra(meth)acrylate, pentaerythritol tri(meth)acrylate, pentaerythritol tetra(meth)acrylate, dipentaerythritol monohydroxypenta(meth)acrylate, dipentaerythritol hexa(meth)acrylate, and 1,4-butane dioldi(meth) acrylate. Further, the ultraviolet curable oligomer component includes various types of oligomers such as urethane-based, polyether-based, polyester-based, polycarbonate-based, and polybutadiene-based oligomers, and its molecular weight is appropriately in a range of about 100 to 30,000. Among these, urethane (meth)acrylate is preferably compounded to enhance the tip protruding property of the bump. The compounding amount of the ultraviolet-ray curable monomer component and the oligomer component can be appropriately determined to an amount in which the adhesive strength of the adhesive layer can be decreased depending on the type of the adhesive layer. Generally, it is for example 5 to 500 parts by weight, and preferably about 40 to 150 parts by weight based on 100 parts by weight of the base polymer such as an acryl polymer constituting the adhesive.

Further, besides the added type ultraviolet curable adhesive described above, the ultraviolet curable adhesive includes an internally-crosslinked ultraviolet curable adhesive using an acryl polymer having a radical reactive carbon-carbon double bond in the polymer side chain, in the main chain, or at the end of the main chain as the base polymer. The internally-crosslinked ultraviolet curable adhesives are preferable because they do not require an oligomer component or other low molecular weight component, which most internally-crosslinked ultraviolet curable adhesives do not contain, and they can form an adhesive layer that has a stable layer structure, where an oligomer component or other low molecular weight component does not migrate in the adhesive over time.

The above-mentioned base polymer, which has a carbon-carbon double bond, may be any polymer that has a carbon-carbon double bond and further is viscous. For such a base polymer, a polymer having an acrylic polymer as a basic skeleton is preferable. Examples of the basic skeleton of the acrylic polymer include the acrylic polymers exemplified above.

The method for introducing a carbon-carbon double bond into any one of the above-mentioned acrylic polymers is not particularly limited, and may be selected from various methods. The introduction of the carbon-carbon double bond into a side chain of the polymer is easier in molecule design. The method is, for example, a method of copolymerizing a monomer having a functional group with an acrylic polymer, and then causing the resultant product to undergo a condensation or addition reaction with a compound having a functional group reactive with the above-mentioned functional group and a carbon-carbon double bond, while preserving the ultraviolet ray curability of the carbon-carbon double bond.

Example combinations of these functional groups include a carboxylic acid group and an epoxy group; a carboxylic acid group and an aziridine group; and a hydroxyl group and an isocyanate group. Of these combinations, the combination of a hydroxyl group and an isocyanate group is preferable for monitoring the extent of the reaction. If the above-mentioned acrylic polymer, which has a carbon-carbon double bond, can be produced by the combination of these functional groups, each of the functional groups may be present on any one of the acrylic polymer and the above-mentioned compound. It is preferable, for the case of the above-mentioned preferred combination, that the acrylic polymer has the hydroxyl group and the above-mentioned compound has the isocyanate group. Examples of the isocyanate compound in this case, which has a carbon-carbon double bond, include methacryloyl isocyanate, 2-methacryloyloxyethyl isocyanate, and m-isopropenyl-α,α-dimethylbenzyl isocyanate. The acrylic polymer may be an acrylic polymer copolymerized with any one of the hydroxyl-containing monomers exemplified above, or an ether compound such as 2-hydroxyethyl vinyl ether, 4-hydroxybutyl vinyl ether or diethylene glycol monovinyl ether.

The intrinsic type (i.e., self cross-linking) ultraviolet-ray curable adhesive may be made only of the above-mentioned base polymer (in particular, the acrylic polymer), which has a carbon-carbon double bond. However, the above-mentioned ultraviolet ray curable monomer component or oligomer component may be incorporated into the base polymer to such an extent that properties of the adhesive are not deteriorated. The amount of the ultraviolet ray curable oligomer component or the like is usually 30 parts or less by weight, preferably from 0 to 10 parts by weight for 100 parts by weight of the base polymer.

In the case that the ultraviolet-ray curable adhesive is cured with ultraviolet rays or the like, a photopolymerization initiator is incorporated into the adhesive. Examples of the photopolymerization initiator include α-ketol compounds such as 4-(2-hydroxyethoxy)phenyl(2-hydroxy-2-propyl)ketone, α-hydroxy-α,α'-dimethylacetophenone, 2-methyl-2-hydroxypropiophenone, and 1-hydroxycyclohexyl phenyl ketone; acetophenone compounds such as methoxyacetophenone, 2,2-dimethoxy-2-phenylacetophenone, 2,2-diethoxyacetophenone, and 2-methyl-1-[4-(methylthio)-phenyl]-2-morpholinopropane-1; benzoin ether compounds such as benzoin ethyl ether, benzoin isopropyl ether, and anisoin methyl ether; ketal compounds such as benzyl dimethyl ketal; aromatic sulfonyl chloride compounds such as 2-naphthalenesulfonyl chloride; optically active oxime compounds such as 1-phenone-1,1-propanedione-2-(o-ethoxycarbonyl)oxime; benzophenone compounds such as benzophenone, benzoylbenzoic acid, and 3,3'-dimethyl-4-methoxybenzophenone; thioxanthone compound such as thioxanthone, 2-chlorothioxanthone, 2-methylthioxanthone, 2,4-dimethylthioxanthone, isopropylthioxanthone, 2,4-dichlorothioxanthone, 2,4-diethylthioxanthone, and 2,4-diisopropylthioxanthone; camphorquinone; halogenated ketones; acylphosphonoxides; and acylphosphonates. The amount of the photopolymerization initiator to be blended is, for example, from about 0.05 to 20 parts by weight for 100 parts by weight of the acrylic polymer or the like which constitutes the adhesive as a base polymer.

When the adhesive layer 14 is formed with an ultraviolet-ray curable adhesive, the layer may be irradiated with an ultraviolet ray in advance to adjust the shear modulus and the melt viscosity. In this case, an example of the ultraviolet-ray intensity is 10 to 1000 mJ/cm$^2$.

When curing inhibition due to oxygen occurs during irradiation with an ultraviolet ray, it is desirable to block oxygen (air) from the surface of the adhesive layer 14 by some method. Examples thereof include a method of performing irradiation with an ultraviolet ray in a nitrogen gas atmosphere.

The thickness of the adhesive layer 14 is not especially limited. However, it is preferably 0.1 times or more and 1.2 times or less the height of the bump and more preferably 0.5 times or more and 1.2 times or less the height of the bump in order to more certainly expose the bumps.

The total of the thickness of the support base 12 and the thickness of the adhesive layer 14 is preferably 20 to 500 μm and more preferably 40 to 200 μm to achieve the desired peeling property.

Support Base

The support base 12 is not especially limited, and a plastic base such as a plastic film or sheet can be suitably used, for example. Examples of such a plastic material include olefin resins such as polyethylene (PE), polypropylene (PP), and an ethylene-propylene copolymer; copolymers having ethylene as a monomer component such as an ethylene-vinyl acetate copolymer (EVA), an ionomer resin, an ethylene-(meth)acrylic acid copolymer, and an ethylene-(meth)acrylate (random or alternating) copolymer; polyesters such as polyethylene terephthalate (PET), polyethylene naphthalate (PEN), and polybutylene terephthalate (PBT); acrylic resins; polyvinyl chloride (PVC); polyurethane; polycarbonate; polyphenylene sulfide (PPS); amide resins such as polyamide (nylon) and wholly aromatic polyamide (aramid); polyetheretherketone (PEEK); polyimide; polyetherimide; polyvinylidene chloride; ABS (acrylonitrile-butadiene-styrene copolymer); cellulose resins; silicone resins; and fluorine resins.

An example of the material of the support base 12 is a polymer such as a crosslinked body of the above-described resins. The above-described plastic film may be unstretched or may be uniaxially stretched or biaxially stretched as necessary. With the resin sheet having a heat shrinking property given by a stretching treatment or the like, the adhesion area of the adhesive layer 14 with the thermosetting resin layer 16 is decreased by heat-shrinking the support base 12 after the film 10 for forming a protective layer is pasted onto the bumped wafer 3, and the support base 12 and the adhesive layer 14 can then be easily peeled from the thermosetting resin layer 16.

The surface of the support base 12 can be subjected to a common surface treatment such as a chemical or physical treatment such as a chromic acid treatment, ozone exposure, flame exposure, high voltage shock exposure, or an ionizing radiation treatment, or a coating treatment by a primer (for example, an adhesive material described later) to enhance adhesion with the adjacent layer, the bonding property, and the like.

The same type or different types of the plastic materials can be appropriately selected and used as the support base 12, and several kinds of plastic materials can be blended and used as necessary. A vapor-deposited layer of a conductive substance made of metals, alloys, oxides of these, or the like and having a thickness of about 30 to 500 Å can be formed on the support base 12 to give an antistatic function. The support base 12 may be a single layer or may be a plurality of layers of two kinds or more.

The thickness of the support base 12 (the total thickness in case of a laminated body) is not especially limited, and it can be appropriately selected according to strength, flexibility, application purpose, and the like. It is preferably 10 to 500 μm and more preferably 20 to 200 μm.

Various additives such as a coloring agent, a filler, a plasticizer, an anti-aging agent, an antioxidant, a surfactant, and a flame retardant may be included in the support base 12 as long as the effect of the present invention is not damaged.

Method of Manufacturing Film for Forming Protective Layer

The method of manufacturing the film 10 for forming a protective layer according to the present embodiment is explained. First, the support base 12 can be formed by a conventionally known film forming method. Examples of the film forming method include a calendering method, a casting method in an organic solvent, an inflation extrusion method in a closed system, a T-die extrusion method, a co-extrusion method, and a dry lamination method.

Next, the adhesive layer 14 is formed by applying an adhesive composition onto the support base 12 and drying (heating and crosslinking as necessary) the composition. Examples of the application method include roll coating, screen coating, and gravure coating. The adhesive layer 14 may be formed on the support base 12 by directly applying the adhesive composition onto the support base 12, or the adhesive layer 14 may be formed by applying the adhesive composition onto release paper whose surface has been subjected to a peeling treatment, and then the adhesive layer 14 may be transferred to the support base 12. When the adhesive layer 14 is an ultraviolet ray curable resin, the adhesive layer 14 is irradiated with an ultraviolet ray to adjust the shear modulus and the melt viscosity of the adhesive layer 14 as necessary.

On the other hand, a coating layer is formed by applying a material for forming the thermosetting resin layer 16 onto release paper so that the thickness of the layer after drying becomes a prescribed thickness, and drying the material under a prescribed condition (performing a heating treatment for drying as necessary when heat curing is necessary). The thermosetting resin layer 16 is formed on the adhesive layer 14 by transferring this coating layer onto the adhesive layer 14. The thermosetting resin layer 16 can be formed on the adhesive layer 14 also by applying a material for forming the thermosetting resin layer 16 directly onto the adhesive layer 14 and drying the material under a prescribed condition (performing a heating treatment for drying as necessary when heat curing is necessary). With this operation, the film 10 for forming a protective layer can be obtained.

Method of Manufacturing Semiconductor Device

In the following, the method of manufacturing a semiconductor device according to the present embodiment is explained by referring to FIGS. 3 to 6. FIGS. 3 to 6 are sectional views schematically showing one example of the method of manufacturing a semiconductor device according to the present embodiment.

The method of manufacturing a semiconductor device according to the present embodiment has at least the steps of pasting the film 10 for forming a protective layer onto the bumped wafer 3 with the thermosetting resin layer 16 being a pasting surface, peeling the support base 12 and the adhesive layer 14 from the thermosetting resin layer 16, forming the protective layer 17 by thermally curing the thermosetting resin layer 16, and dicing the bumped wafer 3 and the protective layer 17 together.

Figure 3:
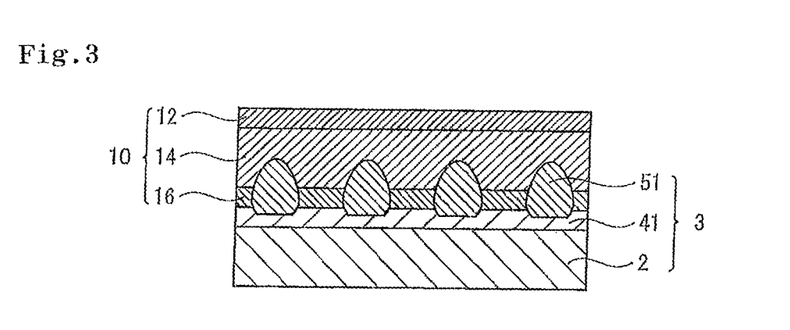
FIG. 3 is a sectional view schematically showing one example of a method of manufacturing a semiconductor device according to the present embodiment.

First, as shown in FIG. 3, the film 10 for forming a protective layer is pasted onto the bumped wafer 3 with the thermosetting resin layer 16 being a pasting surface. The pasting method is not especially limited. However, a pressure-bonding method is preferable. Pressure-bonding is normally performed by pressing the laminate with a pressing means such as a pressure roll. As a pressure-bonding condition, the pressure-bonding temperature is preferably 25 to 150° C. and more preferably 30 to 100° C. The linear pressure is preferably 0.05 to 1.0 MPa and more preferably 0.2 to 1.0 MPa. The pressure-bonding speed is preferably 1 to 100 mm/sec and more preferably 10 to 80 mm/sec. With this operation, the bumps 51 of the bumped wafer 3 protrude from the thermosetting resin layer 16.

Next, backside grinding of the bumped wafer 3 is performed as necessary. Because the film 10 for forming a protective layer is pasted onto the surface where the bumps 51 of the bumped wafer 3 are formed, the bumped wafer 3 can be held and fixed by the film 10 for forming a protective layer. The backside of the bumped wafer 3 is the surface where the bumps 51 of the bumped wafer 3 are not formed.

Next, a dicing tape (not shown in the drawings) is pasted onto the backside of the bumped wafer 3. A conventionally known dicing tape can be used, and also a conventionally known pasting apparatus can be used.

Then, the support base 12 and the adhesive layer 14 are peeled from the thermosetting resin layer 16. When the adhesive layer 14 is made of an ultraviolet-ray curable resin, it is irradiated with an ultraviolet ray from the support base 12 side as necessary. With this operation, the adhesive layer 14 is cured, and the peel strength of the interface between the adhesive layer 14 and the thermosetting resin layer 16 decreases.

For example, a back grinding tape peeling apparatus MA-3000II manufactured by Nitto Seiki Co., Ltd. can be used for peeling. The peel strength of the thermosetting resin layer 16 (before thermal curing) from the adhesive layer 14 is preferably 5 N/20 mm or less (for example, 0.01 N/20 mm to 5 N/20 mm) and more preferably 0.01 N/20 mm to 1 N/20 mm. By making the peel strength of the thermosetting resin layer 16 (before thermal curing) from the adhesive layer 14 within the above-described numerical range, the thermosetting resin layer 16 (before thermal curing) can be favorably peeled from the adhesive layer 14. The value of the peel strength is a value measured by a T-type peeling test (JIS K6854-3) performed at a temperature of 23±2° C., a peeling angle of 180°, a peeling speed of 300 mm/min, and a distance between chucks of 100 mm. An Autograph AGS-H (trade name) manufactured by Shimadzu Corporation is used as a tensile tester.

Figure 4:
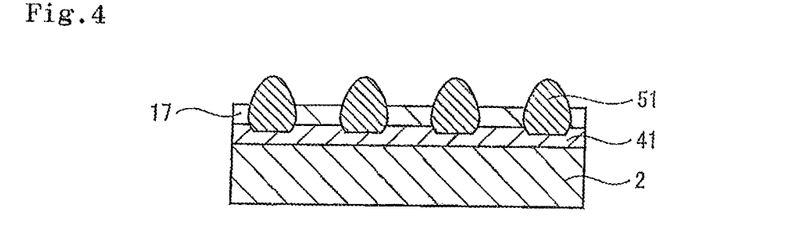
FIG. 4 is a sectional view schematically showing one example of a method of manufacturing a semiconductor device according to the present embodiment.

Next, the protective layer 17 is formed by thermally curing the thermosetting resin layer 16 (see FIG. 4). As a heating condition, the heating temperature is preferably 120 to 200° C. and more preferably 140 to 180° C. The heating time is preferably 30 minutes to 3 hours and more preferably 1 to 2 hours.

Figure 5:
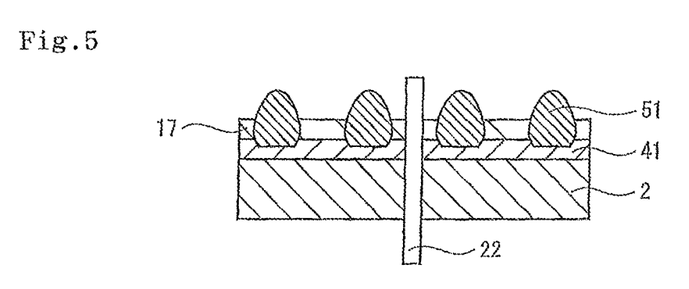
FIG. 5 is a sectional view schematically showing one example of a method of manufacturing a semiconductor device according to the present embodiment.

Then, the bumped wafer 3 is diced together with the protective layer 17 by a dicing blade 22 (see FIG. 5). For dicing, a conventionally known dicing apparatus having a dicing blade can be used, for example. Because the low dielectric material layer 41 of the bumped wafer 3 is diced in a state where it is reinforced with the protective layer 17, the generation of cracks in the low dielectric material layer 41 can be suppressed. Because the low dielectric material layer 41 is diced in a state where it is reinforced with the protective layer 17, the low dielectric material layer 41 does not have to be removed in advance by laser scribing or the like. As a result, an increase in the number of processing steps can be suppressed. However, in the present invention, the low dielectric material layer on a dicing street is preferably removed in advance by laser scribing or the like before dicing (for example, before pasting the bumped wafer to the film for forming a protective layer). This procedure is preferable in that cracks in the low dielectric material layer can more certainly be suppressed.

Figure 6:
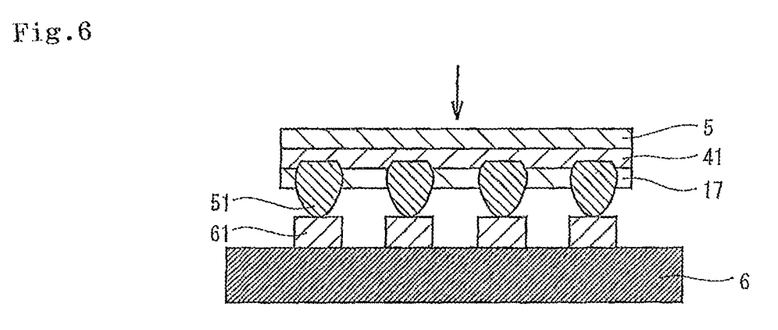
FIG. 6 is a sectional view schematically showing one example of a method of manufacturing a semiconductor device according to the present embodiment.

After that, as shown in FIG. 6, a semiconductor chip 5 individualized by dicing is picked up, and adhered and fixed to an adherend 6. Because the bumps 51 on the semiconductor chip 5 protrude from the protective layer 17, they can be electrically connected to the conductive material 61 on the adherend 6. Specifically, the semiconductor chip 5 is fixed to the adherend 6 by a conventional method in a state where the bumped surface of the semiconductor chip 5 faces the adherend 6. For example, the semiconductor chip 5 can be fixed to the adherend 6, thereby securing the electrical conduction of the semiconductor chip 5 with the adherend 6, by melting a conductive material 61 such as solder while contacting and pressing the bumped surface of the semiconductor chip 5 to the conductive material adhered to a connection pad of the adherend 6. At this time, a space is formed between the semiconductor chip 5 and the adherend 6, and the distance of the space is generally about 30 to 300 μm. After the semiconductor chip 5 is adhered onto the adherend 6, the surface of the semiconductor chip 5 facing the adherend 6 and the space therebetween are washed, and the space is filled and sealed with a sealing material such as a sealing resin.

Various substrates such as a lead frame and a circuit board (wiring circuit board, or the like) can be used as the adherend 6. The material of the substrate is not especially limited, and examples thereof include a ceramic substrate and a plastic substrate. Examples of the plastic substrate include an epoxy substrate, a bismaleimide triazine substrate, and a polyimide substrate.

The material of the bump and the conductive material is not especially limited, and examples thereof include solder (alloys) of a tin-lead metal material, a tin-silver metal material, a tin-silver-copper metal material, a tin-zinc metal material, and a tin-zinc-bismuth metal material, a gold metal material, and a copper metal material.

In this step, it is preferable to wash the opposing surface (electrode forming surface) between the semiconductor chip 5 and the adherend 6 and the space therebetween. The washing liquid used for washing is not especially limited, and examples thereof include an organic washing liquid and an aqueous washing liquid.

Next, a sealing step is performed for sealing the space between the semiconductor chip 5 and the adherend 6. The sealing step is performed using a sealing resin. The sealing condition is not especially limited. Normally, thermal curing of the sealing resin is performed by heating at 175° C. for 60 to 90 seconds. However, the present invention is not limited to this operation, and the resin can be cured at 165 to 185° C. for a few minutes.

The sealing resin should be understood not to be particularly limited, and may be a resin having an insulating property (referred to as an "insulating resin"). Accordingly, sealing materials such as known sealing resins can be appropriately selected and used. However, an insulating resin having substantial elasticity is more preferable. Examples of the sealing resin include a resin composition containing an epoxy resin. The epoxy resins exemplified above can be used. In the epoxy-containing sealing resin, a thermosetting resin other than the epoxy resin such as a phenol resin, a thermoplastic resin, or the like may be contained as a resin component besides the epoxy resin. The phenol resin can be used as a curing agent for the epoxy resin, and examples of the phenol resin include the phenol resins exemplified above.

Below, preferred examples of the present invention are explained in detail. However, materials, addition amounts, and the like described in these examples are not intended to limit the scope of the present invention, and shall be understood merely to be illustrative examples for the purposes of explanation, and any limitations specifically described below shall be understood as example limitations.

<Preparation of Support Base>

A polyethylene terephthalate film (PET film) having a thickness of 50 μm, a polyethylene film (PE film) having a thickness of 50 μm, and an ethylene vinyl acetate copolymer film (EVA film) having a thickness of 120 μm were prepared.

<Production of Adhesive Layer>

An adhesive layer was obtained by applying the following adhesive composition solution A onto the prepared support base and drying the solution. The thickness of the produced adhesive layer is shown in Table 1.

Adhesive Composition Solution A 86.4 parts of 2-ethylhexyl acrylate (hereinafter, also referred to as "2EHA"), 13.6 parts of 2-hydroxyethyl acrylate (hereinafter, also referred to as "HEA"), 0.2 parts of benzoyl peroxide, and 65 parts of toluene were charged into a reactor having a cooling tube, a nitrogen introducing tube, a thermometer, and a stirrer, and then polymerized at 61° C. in a nitrogen gas stream for 6 hours to give an acrylic polymer A.

An acrylic polymer A' was obtained by adding 14.6 parts of 2-methacryloyloxyethyl isocyanate (hereinafter, also referred to as "MOI") to the acrylic polymer A and performing an addition reaction at 50° C. in an air stream for 48 hours.

Next, an adhesive composition solution A was obtained by adding 8 parts of a polyisocyanate compound (trade name: Coronate L manufactured by Nippon Polyurethane Industry Co., Ltd.) and 5 parts of a photopolymerization initiator (trade name: Irgacure 651 manufactured by Ciba Specialty Chemicals Inc.) into 100 parts of the acrylic polymer A'.

<Production of Thermosetting Resin Layer>

Thermosetting Resin Layer a 31.6 parts of a naphthalene type epoxy resin having an epoxy equivalent of 142 g/eq (trade name: HP4032D manufactured by DIC Co., Ltd.), 7.9 parts of a trisphenol meta type epoxy resin having an epoxy equivalent of 169 g/eq (trade name: EPPN501HY manufactured by Nippon Kayaku Co., Ltd.), 47.3 parts of an aralkyl type phenol resin having a phenol equivalent of 175 g/eq (trade name: MEHC7800S manufactured by Meiwa Plastic Industries, Ltd.), 12 parts of a butyl acrylate-acrylonitrile-glycidyl methacrylate copolymer (trade name: SG-28GM manufactured by Nagase ChemteX Corporation), and 1.2 parts of triphenylphosphine as a curing catalyst were dissolved in methylethylketone to prepare a solution of the adhesive composition having a solid concentration of 38.6% by weight.

A thermosetting resin layer a having the thickness shown in Table 1 was produced by applying this solution of the adhesive composition onto a release film made of a polyethylene terephthalate film having a thickness of 50 μm which had been subjected to a silicone release treatment as a release liner (separator), and drying the solution at 130° C. for 2 minutes.

Thermosetting Resin Layer b 38.1 parts of a trisphenol meta type epoxy resin having an epoxy equivalent of 169 g/eq (trade name: EPPN501HY manufactured by Nippon Kayaku Co., Ltd.), 40.8 parts of an aralkyl type phenol resin having a phenol equivalent of 175 g/eq (trade name: MEHC7800S manufactured by Meiwa Plastic Industries, Ltd.), 20 parts of a butyl acrylate-acrylonitrile-ethyl methacrylate copolymer (trade name: SG-P3 manufactured by Nagase ChemteX Corporation), and 1.2 parts of triphenylphosphine as a curing catalyst were dissolved in methylethylketone to prepare a solution of the adhesive composition having a solid concentration of 48.0% by weight.

A thermosetting resin layer b having the thickness shown in Table 1 was produced by applying this solution of adhesive composition onto a release film made of a polyethylene terephthalate film having a thickness of 50 μm which had been subjected to a silicone release treatment as a release liner (separator), and drying the solution at 130° C. for 2 minutes.

Thermosetting Resin Layer c 34.4 parts of a bisphenol A type epoxy resin having an epoxy equivalent of 185 g/eq (trade name: YL-980 manufactured by Japan Epoxy Resin Co., Ltd.), 14.8 parts of a trisphenol meta type epoxy resin having an epoxy equivalent of 169 g/eq (trade name: EPPN501HY manufactured by Nippon Kayaku Co., Ltd.), 22.6 parts of an aralkyl type phenol resin having a phenol equivalent of 175 g/eq (trade name: MEHC7800S manufactured by Meiwa Plastic Industries, Ltd.), 15.1 parts of a phenol novolac resin having a phenol equivalent of 105 g/eq (trade name: GS-180 manufactured by Gun Ei Chemical Industry Co., Ltd.), 12 parts of a butyl acrylate-acrylonitrile-ethyl methacrylate copolymer (trade name: SG-P3 manufactured by Nagase ChemteX Corporation), and 1.2 parts of triphenylphosphine as a curing catalyst were dissolved in methylethylketone to prepare a solution of the adhesive composition having a solid concentration of 54.4% by weight.

A thermosetting resin layer c having the thickness shown in Table 1 was produced by applying this solution of adhesive composition onto a release film made of a polyethylene terephthalate film having a thickness of 50 μm which had been subjected to a silicone release treatment as a release liner (separator) and drying the solution at 130° C. for 2 minutes.

<Production of Film for Forming Protective Layer>

Films for forming a protective layer according to the Examples and the Comparative Examples were produced by pasting each of the thermosetting resin layers produced above onto each of the adhesive layers produced above. Combinations of the support base, adhesive layer, and thermosetting resin layer of the films for forming a protective layer according to the Examples and the Comparative Examples are shown in Table 1.

The conditions of the lamination step are as follows.

<Laminator Condition>
Laminator: roll laminator
Laminating speed: 1 mm/min
Laminating pressure: 0.5 MPa
Laminator temperature: room temperature (23° C.)
Measurement of Shear Modulus of Adhesive Layer The shear modulus of the adhesive layers (for Examples 3 to 9, adhesive layers after being irradiated with an ultraviolet ray shown in Table 1) was measured. The shear modulus was measured by forming an adhesive layer (thickness 0.2 mm) using the prepared adhesive composition solution A using a shear modulus measurement apparatus (ARES manufactured by Rheometric Scientific FE, Ltd.) Specifically, the shear modulus of the sample was measured at the "pasting temperature" shown in Table 1 under a condition of a frequency of 1 Hz, a plate diameter of 7.9 mm φ, and a strain of 1%. The results are shown in Table 1.

Measurement of Melt Viscosity

The melt viscosity of the thermosetting resin layer (before thermal curing) was measured. The melt viscosity is measured by a parallel plate method using a rheometer (RS-1 manufactured by Haake GmbH). In more detail, the measurement is performed using a gap of 100 μm, a rotating cone diameter of 20 mm, and a rotational speed of $10\ s^{-1}$ at a temperature in the range of room temperature to 250° C. The melt viscosity at the "pasting temperature" shown in Table 1 was regarded as the measured value. The results are shown in Table 1.

Peel Strength of Adhesive Layer and Thermosetting Resin Layer and Peeling Property at the Interface Between Adhesive Layer and Thermosetting Resin Layer Each of the films for forming a protective layer in the Examples and the Comparative Examples were pasted onto the surface of a bumped silicon wafer where bumps were formed with the thermosetting resin layer as the a pasting surface. The following wafer was used as the bumped silicon wafer. The pasting conditions were as follows.

<Bumped Silicon Wafer>
Thickness of silicon wafer: 200 μm
Material of low dielectric material layer: SiN film
Thickness of low dielectric material layer: 0.3 μm
Height of bump: 65 μm
Pitch of bump: 150 μm
Material of bump: solder <Pasting Condition>
Pasting apparatus: DR-3000II manufactured by Nitto Seiki Co., Ltd.
Laminating speed: 0.1 mm/min
Laminating pressure: 0.5 MPa
Laminator temperature: set at the "pasting temperature" in Table 1

Then, the peel strength of the adhesive layer from the thermosetting resin layer was measured. Specifically, a T-type peeling test (JIS K6854-3) as a tensile test was performed at a temperature of 23±2° C., a peeling angle of 180°, a peeling speed of 300 mm/min, and a distance between chucks of 100 mm using an Autograph AGS-H (trade name) manufactured by Shimadzu Corporation. The results are shown in Table 1. The adhesive layer was cured in Examples 1 and 2 by irradiation with an ultraviolet ray from the support base side. For ultraviolet irradiation, an ultraviolet ray irradiation apparatus (trade name: UM810 manufactured by Nitto Seiki Co., Ltd.) was used and the ultraviolet ray irradiation intensity was set to 400 mJ/cm². After that, the peel strength of the adhesive layer on the thermosetting resin layer was measured. The results are shown in Table 1 as "peel strength of adhesive layer on thermosetting resin layer before peeling and after irradiation with ultraviolet ray."

The ability to peel the adhesive layer with a support base from the protective layer (thermosetting resin layer) was evaluated. The evaluation results are shown in Table 1, by marking cases where the adhesive layer was peeled from the thermosetting resin layer at the interface as o and marking cases where it was not peeled as x.

Whether the tip of bump is exposed or not

The evaluation was performed by observing the surface of the semiconductor wafer side of the sample used in the peeling test. The results are shown in Table 1, by marking cases where the tip of the bump was exposed as o and cases where it is not exposed as x.

Dicing Property

After observation of the exposure of the tip of the bump, a protective layer was formed by curing the thermosetting resin layer by heating at 175° C. for 2 hours. After that, dicing of the bumped silicon wafer was performed. The bumped silicon wafer was diced together with the protective layer using DU-300 manufactured by Nitto Denko Corporation as the dicing tape and DFD6361 (trade name) manufactured by DISCO Corporation as the dicing apparatus. The evaluation was performed by marking cases where the dicing was successful, where there was no peeling or chipping of the low dielectric material layer, as o, and by marking cases where there was even a little peeling or chipping of the low dielectric material layer, as x. The results are shown in Table 1.

<Dicing Condition>
Dicing size: 10 mm×10 mm
Dicing speed: 30 mm/sec
Spindle rotating speed: 40000 rpm

TABLE 1

|  |  | Example 1 | Example 2 | Example 3 | Example 4 | Example 5 | Example 6 | Example 7 | Example 8 | Example 9 |
|---|---|---|---|---|---|---|---|---|---|---|
| PASTING TEMPERATURE [° C.] | | 75 | 75 | 75 | 75 | 100 | 65 | 75 | 75 | 50 |
| SUPPORT BASE | MATERIAL | PET | PET | PET | PET | PET | PET | PET | PET | PET |
|  | THICKNESS (μm) | 50 | 50 | 50 | 50 | 50 | 50 | 50 | 50 | 50 |
| ADHESIVE LAYER | TYPE OF SOLUTION | A | A | A | A | A | A | A | A | A |
|  | THICKNESS | 30 | 60 | 30 | 60 | 30 | 30 | 30 | 30 | 30 |
|  | ULTRAVIOLET RAY IRRADIATION INTENSITY (mJ/cm$^2$) | 0 | 0 | 400 | 400 | 400 | 400 | 400 | 400 | 400 |
|  | SHEAR MODULUS (Pa) AT PASTING TEMPERATURE | $3.8 \times 10^4$ | $3.8 \times 10^4$ | $5.7 \times 10^5$ | $5.7 \times 10^5$ | $4.5 \times 10^4$ | $2.9 \times 10^5$ | $5.7 \times 10^5$ | $5.7 \times 10^5$ | $1.2 \times 10^6$ |
| THERMOSETTING RESIN LAYER | TYPE OF SOLUTION | a | a | a | a | a | a | a | a | a |
|  | THICKNESS (μm) | 40 | 40 | 40 | 40 | 40 | 40 | 60 | 5 | 40 |
|  | MELT VISCOSITY (Pa·S) AT PASTING TEMPERATURE | $1.5 \times 10^3$ | $1.5 \times 10^3$ | $1.5 \times 10^3$ | $1.5 \times 10^3$ | $4.5 \times 10^2$ | $1.2 \times 10^4$ | $1.5 \times 10^3$ | $1.5 \times 10^3$ | $1.7 \times 10^4$ |
| INITIAL PEEL STRENGTH (N/20 mm) OF ADHESIVE LAYER ON THERMOSETTING RESIN LAYER | | >2 | >2 | 0.04 | 0.03 | 0.04 | 0.04 | 0.04 | 0.04 | 0.04 |
| IRRADIATION WITH ULTRAVIOLET RAY BEFORE PEELING | | YES | YES | NO | NO | NO | NO | NO | NO | NO |
| PEEL STRENGTH (N/20 mm) OF ADHESIVE LAYER ON THERMOSETTING RESIN LAYER BEFORE PEELING AND AFTER IRRADIATION WITH ULTRAVIOLET RAY | | 0.04 | 0.04 | — | — | — | — | — | — | — |
| PEELING PROPERTY | | ○ | ○ | ○ | ○ | ○ | ○ | ○ | ○ | ○ |
| WHETHER TIP OF BUMP IS EXPOSED OR NOT | | ○ | ○ | ○ | ○ | ○ | ○ | ○ | ○ | ○ |
| THICKNESS RATIO THICKNESS OF THERMOSETTING RESIN LAYER/BUMP HEIGHT | | 40/65 | 40/65 | 40/65 | 40/65 | 40/65 | 40/65 | 60/65 | 5/65 | 5/65 |
| DICING PROPERTY | | ○ | ○ | ○ | ○ | ○ | ○ | ○ | ○ | ○ |

(Results)

Cracks were not generated in the low dielectric material layer in the films for forming a protective layer of Examples 1 to 9 because the dielectric material layer of the bumped silicon wafer was diced while reinforced by the protective layer.

What is claimed is:

1. A method of manufacturing a semiconductor device, comprising the steps of:
    pasting a film for forming a protective layer in which a support base, an adhesive layer, and a thermosetting resin layer are laminated, in this order, onto a bumped wafer in which a low dielectric material layer is formed, with the thermosetting resin layer serving as a pasting surface,
    peeling the support base and the adhesive layer from the thermosetting resin layer,
    forming a protective layer by thermally curing the thermosetting resin layer, and
    dicing the bumped wafer and the protective layer together.

2. The manufacturing method according to claim 1, wherein
    a melt viscosity of the thermosetting resin layer is $1 \times 10^2$ Pa·S or more and $2 \times 10^4$ Pa·S or less at a temperature when the film for forming a protective layer is pasted onto the bumped wafer, and
    a shear modulus of the adhesive layer is $1 \times 10^3$ Pa or more and $2 \times 10^6$ Pa or less at the temperature when the film for forming a protective layer is pasted onto the bumped wafer.

3. The manufacturing method according to claim 2, wherein
    the thermosetting resin layer has a thickness of 0.05 to 0.9 times a height of a bump on the bumped wafer.

4. The manufacturing method according to claim 1, wherein
    the thermosetting resin layer has a thickness of 0.05 to 0.9 times a height of a bump on the bumped wafer.

* * * * *